United States Patent
Choi et al.

(10) Patent No.: US 7,426,129 B2
(45) Date of Patent: Sep. 16, 2008

(54) LAYOUT STRUCTURES IN SEMICONDUCTOR MEMORY DEVICES INCLUDING BIT LINE LAYOUT FOR HIGHER DENSITY MIGRATION

(75) Inventors: Byung-Gil Choi, Gyeonggi-do (KR); Young-Ho Suh, Gyeonggi-do (KR); Choong-Keun Kwak, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 256 days.

(21) Appl. No.: 11/183,613

(22) Filed: Jul. 18, 2005

(65) Prior Publication Data

US 2006/0104102 A1    May 18, 2006

(30) Foreign Application Priority Data

Nov. 18, 2004    (KR) ...................... 10-2004-0094440

(51) Int. Cl.
    *G11C 5/06*    (2006.01)

(52) U.S. Cl. ............... 365/63; 365/185.13; 365/185.05; 365/185.06

(58) Field of Classification Search ................... 365/63, 365/185.13, 185.05, 185.06
See application file for complete search history.

(56) References Cited

U.S. PATENT DOCUMENTS

| | | | | | | |
|---|---|---|---|---|---|---|
| 5,973,983 | A | * | 10/1999 | Hidaka | ................... | 365/230.03 |
| 6,069,815 | A | * | 5/2000 | Mueller et al. | ................. | 365/63 |
| 6,104,653 | A | * | 8/2000 | Proebsting | ................... | 365/203 |
| 6,163,475 | A | * | 12/2000 | Proebsting | ................... | 365/63 |

* cited by examiner

*Primary Examiner*—Tuan T. Nguyen
(74) *Attorney, Agent, or Firm*—Myers Bigel Sibley & Sajovec, P.A.

(57) ABSTRACT

A true bit line can extend across a memory cell area of the memory device in a first direction and a complementary bit line can extend across the memory cell area in a second direction opposing the first direction, wherein the true bit line and the complementary bit line comprising a bit line pair.

13 Claims, 4 Drawing Sheets

LAYOUT STRUCTURES IN SEMICONDUCTOR MEMORY DEVICES INCLUDING BIT LINE LAYOUT FOR HIGHER DENSITY MIGRATION

CROSS-REFERENCE TO RELATED APPLICATION

This application claims the benefit of Korean Patent Application No. 2004-0094440, filed Nov. 18, 2004, the disclosure of which is hereby incorporated herein by reference in its entirety.

FIELD OF THE INVENTION

The present invention relates to semiconductor memory devices and, more particularly, to a layout of a memory device.

BACKGROUND

As a density of a memory cell is increased, the number of memory cells connected to a pair of (or one bit line) is increased. Accordingly, parasitic Resistance and Capacitance (RC) of the bit line may be increased and, therefore, the memory cells connected to each bit line may also be increased, which can reduce the speed of reading/writing the device. Further, when one bit line is selected to read or write information, current is provided to or discharged from the capacitance of the bit line. Accordingly, if the memory cells connected to each bit line are increased in number, the capacitance of the bit line may also increase, which can increase the current consumption of the memory product. In order to prevent/reduce this, even though the memory cells are increased in density, the memory cells may be kept constant. However, it may be difficult to prevent the chip from increasing in size, thereby increasing cost.

The changes in memory process technology shows that if the density is increased, a minimal line width of a circuit may be decreased. However, a line width in a core area of the memory may be reduced less than line width in the memory cell area. As the area of the memory cell is reduced, the layout of circuits in the core area connected to the bit lines (e.g., a column pass unit or a precharge unit) may become more difficult.

FIG. 1 is a view illustrating a conventional bit line layout structure in a semiconductor memory device. Referring to FIG. 1, a plurality of local bit line pairs (BLi-BLBi) each include a local bit line (BLi) and a complementary local bit line (BLBi) connected, in the same direction, to a global bit line pair (GBLi-GBLBi) each including a global bit line (GBLi) and a complementary global bit line (GBLBi). In FIG. 1, four local bit line pairs are connected to one global bit line pair. According to FIG. 1, reference numeral 41 denotes a memory cell area, reference numerals 22 and 20 denote interconnection layer areas, and a reference numeral 30 denotes a core area or a cell peripheral area. A first node (N01) connects the global bit line (GBLi) with the local bit lines (BL0, BL1, BL2 and BL3), and a second node (N02) connects the complementary global bit line (GBLBi) with the complementary local bit lines (BL0B, BL1B, BL2B and BL3B).

As described above, conventional bit line layout structures may not be optimal, and the interconnection layer for signal connections may be increased in kind.

SUMMARY

Embodiments according to the invention can provide layout structures in semiconductor memory devices including bit line layout for higher density migration. In some embodiments according to the invention, a true bit line can extend across a memory cell area of the memory device in a first direction and a complementary bit line can extend across the memory cell area in a second direction opposing the first direction, wherein the true bit line and the complementary bit line comprising a bit line pair.

In some embodiments according to the invention, a first column pass transistor is coupled to a true bit line extending across a memory cell area of the memory device. A second column pass transistor is coupled to a complementary bit line extending across the memory cell area and a memory cell in the memory cell area between the first and second column pass transistors.

In some embodiments according to the invention, the memory cell is coupled to the true bit line and to the complementary bit line. In some embodiments according to the invention, the first and second column pass transistors are located on opposite sides of the memory cell area.

In some embodiments according to the invention, the first column pass is includes in a plurality of first column pass transistors and the second column pass transistor is included in a plurality of second column pass transistors. The device can further include a first node that electrically couples outputs of the plurality of first column pass transistors together to provide a global true bit line and a second node that electrically couples outputs of the plurality of second column pass transistors together to provide a global complementary bit line.

In some embodiments according to the invention, the first and second nodes are located on opposite sides of the memory cell area. In some embodiments according to the invention, the global complementary bit line or the global true bit line extends between opposite sides of the memory cells area toward a write driver circuit and/or a sense amplifier circuit.

In some embodiments according to the invention, the first and second column pass transistors overlap in a direction in which the true and complementary bit lines extend across the memory cell area. In some embodiments according to the invention, the first and second overlapping column pass transistors comprises a zig-zag pattern.

In some embodiments according to the invention, an integrated circuit memory device includes a memory cell area of the memory device including a plurality of memory cells each coupled to a local true bit line extending across the memory cell area toward a first core area of the memory device and to a negative local bit line extending across the memory cell area toward a second core area of the memory device opposite the first core area. A first column pass transistor in the first core area is coupled to the true local bit line and a second column pass transistor in the second core area is coupled to the complementary bit line, wherein the first and second column pass transistors are located to overlap one another in a direction in which local bit lines extend across the memory core area.

In some embodiments according to the invention, the first and second overlapping column pass transistors are in a zigzag pattern so that the first and second column pass transistors are alternatingly arranged on opposing sides of the memory cell area.

In some embodiments according to the invention, the column pass transistors are coupled to precharge transistors. In some embodiments according to the invention, the bit line and the complementary bit line are a local bit line pair coupled to a corresponding global bit line pair.

Figure 1:
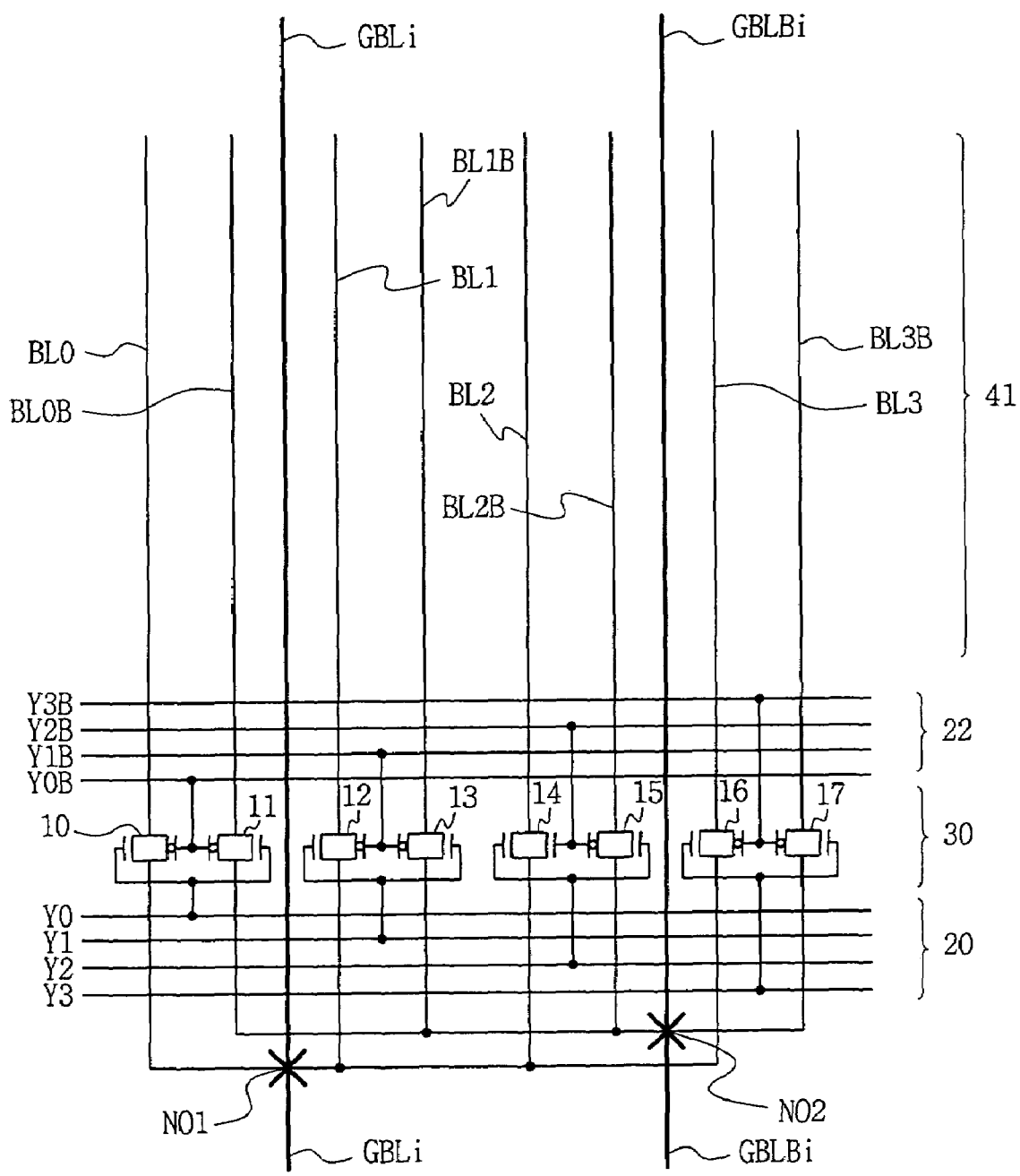
FIG. 1 is a view illustrating a conventional bit line layout structure in a semiconductor memory device.

DESCRIPTION OF EMBODIMENTS
ACCORDING TO THE INVENTION

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that if an element such as a bit line is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "bottom", "upper", "top", "beneath", "above", and the like are used herein to describe one element's relationship to another elements as illustrated in the Figures. It will be understood that relative terms are intended to encompass different orientations of the subject in the figures in addition to the orientation depicted in the Figures. For example, if the subject in the Figures is turned over, elements described as being on the "lower" side of or "below" other elements would then be oriented on "upper" sides of (or "above") the other elements. The exemplary term "lower", can therefore, encompasses both an orientation of "lower" and "upper," depending of the particular orientation of the figure. Similarly, if the subject in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as having squared edges will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As appreciated by the present inventors, reducing the size of the memory cells in the cell area 41 may increase the difficulty of the layout of the column pass transistors 10, 11-17 in the core area 30 in FIG. 1. This is because the column pass transistors 10, 11-17 and precharge transistors (not shown) are concentrated in the cell area 30, which may increase the difficulty of the core layout when the size of the memory cells in the cell area are reduced.

Figure 2:
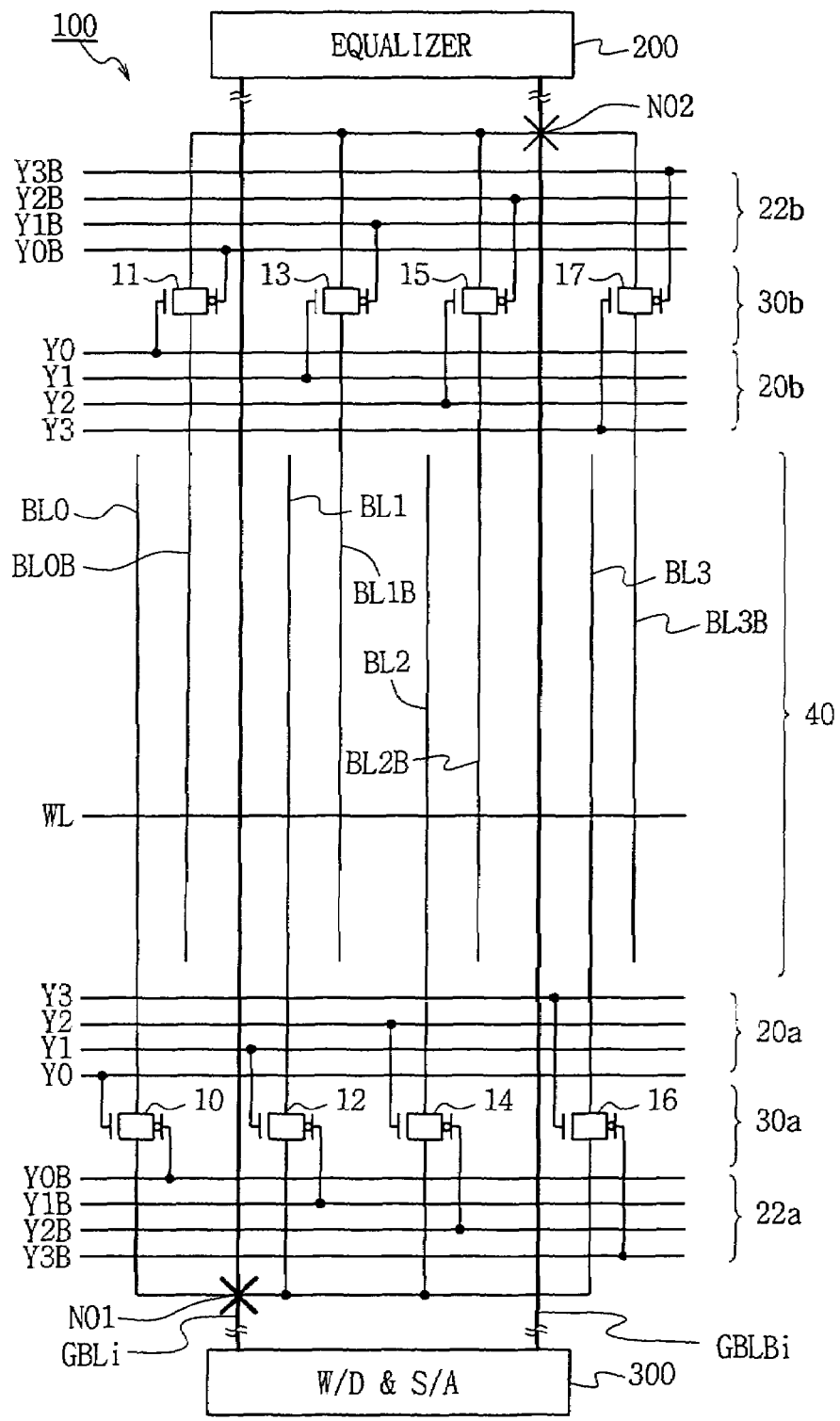
FIG. 2 is a view illustrating a bit line layout structure in a semiconductor memory device according to an embodiment of the present invention.

FIG. 2 is a view illustrating a bit line layout structure in a semiconductor memory device according to some embodiments of the present invention. FIG. 2 illustrates an example of four local bit line pairs connected to one global bit line pair. Referring to FIG. 2, bit lines (BL0, BL1, BL2 and BL3) and complementary bit lines (BL0B, BL1B, BL2B and BL3B) provide the local bit line pairs, which are connected to column pass transistors (10, 12, 14 and 16) and (11, 13, 15 and 17) respectively. Each of the column pass transistors (10, 12, 14 and 16) and (11, 13, 15 and 17) included in a bit line pair (10/11, 12/13, 15/15, 16/17) are separated from one another and located on opposite sides of a sub memory cell area 40 (i.e., the sub memory cell area 40 is located between the ones of the column pass transistors that comprise the bit line pairs). In other words, the bit lines (BL0, BL1, BL2 and BL3) and the complementary bit lines (BL0B, BL1B, BL2B and BL3B) are alternatingly located on the ends of the sub memory cell area 40) to have a zig-zag pattern such that the column pass transistors (10, 12, 14 and 16) and (11, 13, 15 and 17) and precharge transistors (not shown) are divided and disposed at both sides of a top and a bottom of the memory cell area 40 in FIG. 2.

An equalizer 200 and a write driver and sense amplifier 300 are respectively connected, at the top and the bottom in FIG. 2, to a global bit line pair (GBLi-GBLBi) having a global bit line (GBLi) and a complementary global bit line (GBLBi). The equalizer 200 provides the same voltage level between the global bit line pair. Reference numerals 20a, 22a, 20b and 22b denote interconnection layer areas in which column selection signals are applied to corresponding column selection transistors.

A first node (N01) is connected to the global bit line (GBLi) at a bottom of FIG. 2. Accordingly, the local bit lines (BL0, BL1, BL2 and BL3) are connected to the global bit line (GBLi) via the first node (N01). A second node (N02) is connected to the complementary global bit line (GBLBi) at a top of FIG. 2, and the complementary local bit lines (BL0B, BL1B, BL2B and BL3B) are connected to the complementary global bit line (GBLBi) via the second node (N02).

In some embodiments according to the invention, the local bit line pairs having the local bit line and the complementary bit line are laid out to have the zig-zag pattern, the column pass transistors 10, 12, 14 and 16 respectively correspondingly connected to the local bit lines (BL0, BL1, BL2 and BL3) are disposed at a lower core area 30a of the memory cell area 40, and the column pass transistors 11, 13, 15 and 17 respectively correspondingly connected to the complementary local bit lines (BL0B, BL1B, BL2B and BL3B) are disposed at an upper core area 30b of the memory cell area 40. In other words, the local bit lines (BL0, BL1, BL2 and BL3) and the local bit lines (BL0B, BL1B, BL2B and BL3B) each extend from opposing sides of the memory cell area 40 toward each other. Accordingly, a layout margin in a word line (WD) direction in FIG. 2 can be improved in comparison with that of FIG. 1.

As a result, the transistors included in the core circuit face each other (are located on opposing sides of the memory cell area 40) to reduce the concentration of the core circuit on one side of the memory cell area 40. Therefore, the layout of the core area may be reduced so that the layout of the high-density memory cell 40 can be reduced while allowing the core circuit areas to reduced more easily.

As shown in the hierarchical bit line structure of FIG. 2, even in case where a unit area of the memory cell disposed at an intersection of the word line and the bit line is reduced in size within the cell area 40, the core circuits (for example, the column pass transistors and the precharge transistors) are divided and disposed on opposing sides of the cell area 40.

Figure 3:
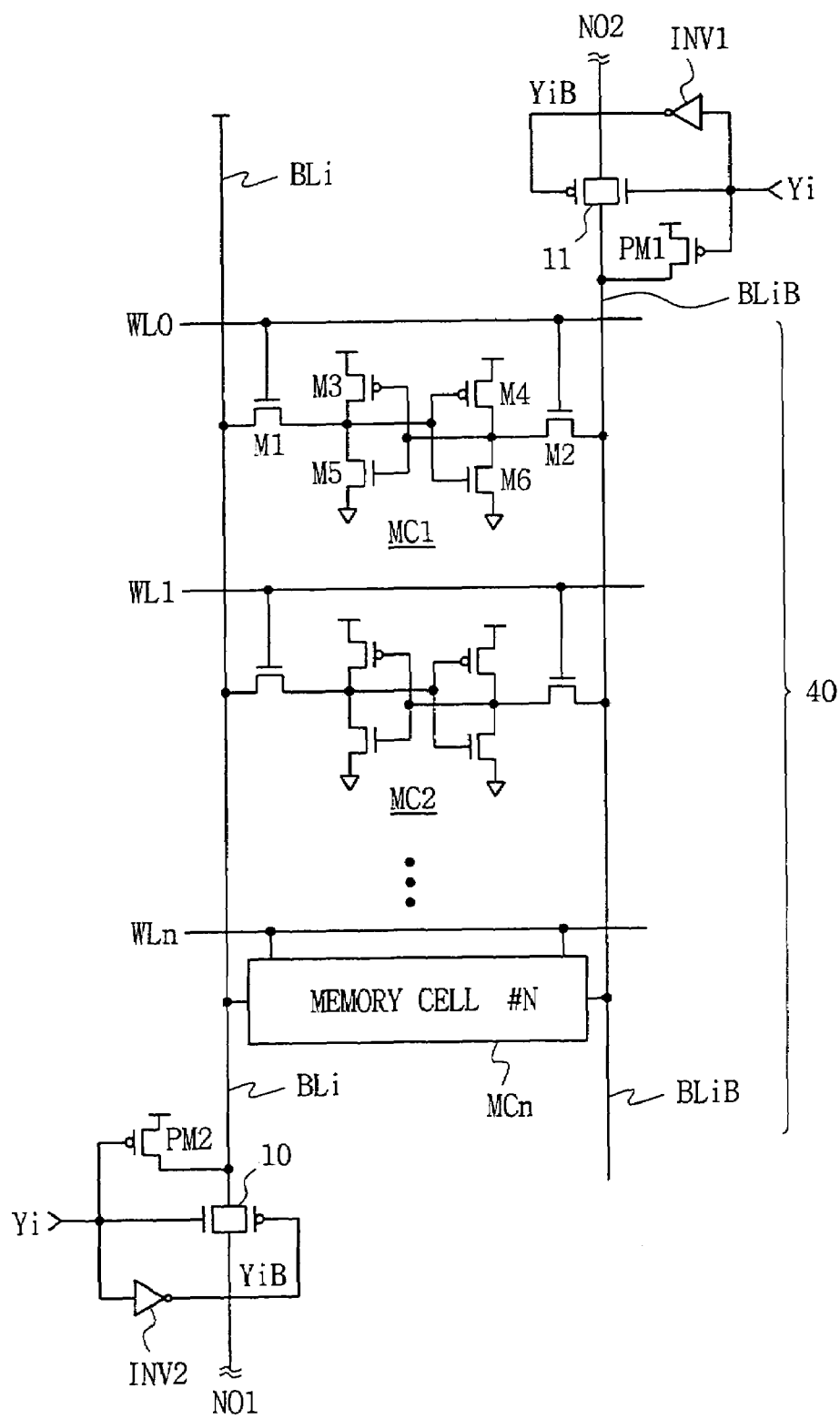
FIG. 3 is a partial detailed view illustrating a bit line layout structure of FIG. 2.

FIG. 3 is a partial detailed view illustrating the bit line layout structure of FIG. 2. In FIG. 3, a plurality of memory cells (MC1, MC2, . . . , MCn), the column pass transistors 10 and 11, and the precharge transistors (PM1 and PM2) are connected to one local (or partial) bit line pair (BLi-BLiB). In a static memory, the memory cell includes six transistors (M1-M6), and the column pass transistor 10 connects and operates the local bit line (BLi) and the global bit line (GBLi) in response to a column selection signal (Yi). The column pass transistor 10 includes a Complementary Metal Oxidation Semiconductor (CMOS) transmission gate. The precharge transistor (PM2) includes a gate for receiving the column selection signal (Yi), a source connected to a source voltage, and a drain connected to the local bit line (BLi). The precharge transistor (PM2) is turned on in a precharge operation mode to precharge the local bit line to a level of the source voltage. The precharge transistor (PM1) connected to the local bit line (BLiB) is disposed at an opposite side of the precharge transistor (PM2) on the basis of the cell area 40.

In some embodiments according to the invention, where a cell size is reduced in a direction in which the word line (WLi) extends (as shown in FIG. 3), the transistors provided in the core circuit and correspondingly connected to the bit lines are divided and disposed at opposing sides on the basis of the memory cell area 40. Accordingly, the layout margin may be improved in the core area so that more highly integrated technology can be used to re-deploy the same circuitry while reducing the re-design of the layout. In some embodiments according to the invention, the memory cell area 40 can be a part of one sub mat in a whole memory cell area of the semiconductor memory device.

Figure 4:
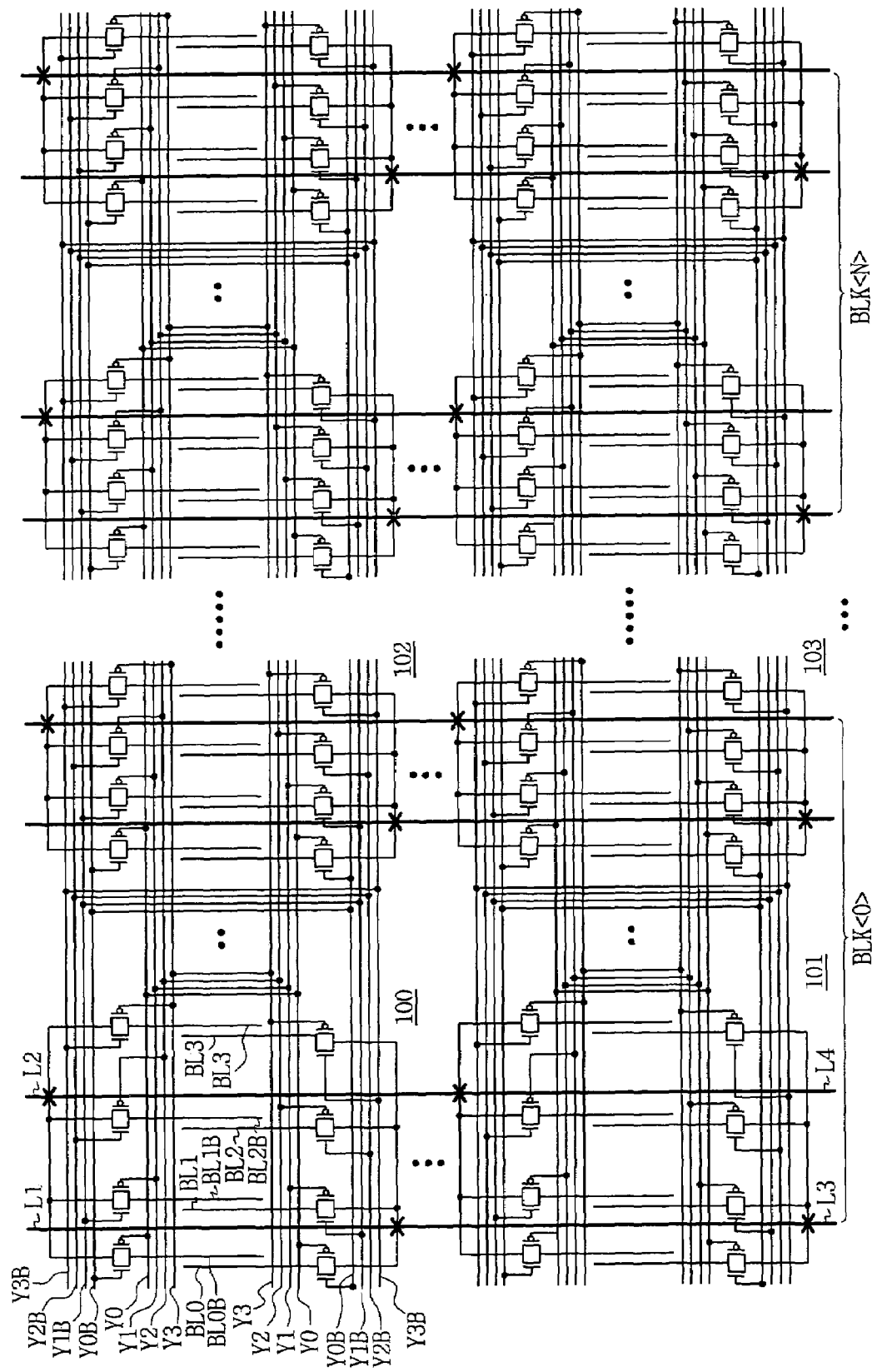
FIG. 4 is a view illustrating a bit line layout structure of FIG. 2 extended in a whole memory cell area.

FIG. 4 is a view illustrating the bit line layout structure of FIG. 2 extended to the whole memory cell area. In FIG. 4, the hierarchical bit line structure is extended to a plurality of sub mats. Referring to FIG. 4, the plurality of sub mats 100, 101, 102 and 103 constituting one memory cell (BLK0) respectively have the bit line layout structure of FIG. 2 in the memory cell area.

As described above, in some embodiments according to the invention, a pair of bit lines (representing a true and complementary bit line associated with a memory cell) can extend from opposite sides of a memory cell array including the memory cell. For example, as shown in FIG. 4, a true bit line BL0 can extend from column pass transistors located on a lower side of the memory cell array whereas the complimentary bit line BL0B extends from a column pass transistor located on an upper side of the memory cell array toward the lower side. Therefore, the layout of the true and complimentary bit lines associated with respective column pass transistors can approximate a zigzag pattern such that the individual bit lines (included in a true and complementary pair) originate from opposing sides of the memory cell array. Furthermore, the column pass transistors associated with the true and complimentary bit lines in a pair associated with a particular memory cell are located on opposing sides of the memory cell array. Therefore, the column pass transistors can be located alternatingly at opposing sides of the memory cell array.

In still further embodiments according to the invention, the column pass transistors located on the opposing sides of the memory cell array may overlap one another in the direction in which a word lines extends. For example, in referring to FIG. 2, the column pass transistor 10 located on a lower side of the memory cell array 40 can partially overlap the column pass transistor 11 located at the upper side of the memory cell array so that the respective bit lines BL0 and BL0B can be more closely spaced than when the column pass transistors are located side by side (as shown for example in FIG. 1).

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. An integrated circuit memory device comprising:
   a true bit line extending across a memory cell area of the memory device in a first direction; and
   a complementary bit line extending across the memory cell area in a second direction opposing the first direction, the true bit line and the complementary bit line comprising a bit line pair, further comprising:

a first column pass transistor coupled to the true bit line;

a second column pass transistor coupled to the complementary bit line; and a memory cell in the memory cell area between the first and second column pass transistors, wherein the first and second column pass transistors overlap in a direction in which the true and complementary bit lines extend across the memory cell area.

2. A memory device according to claim 1 wherein the memory cell is coupled to the true bit line and to the complementary bit line.

3. A memory device according to claim 1 wherein the first and second column pass transistors are located on opposite sides of the memory cell area.

4. A memory device according to claim 3 wherein the first column pass is included in a plurality of first column pass transistors and the second column pass transistor is included in a plurality of second column pass transistors, the device further comprising:

a first node electrically coupling outputs of the plurality of first column pass transistors together to provide a global true bit line; and a second node electrically coupling outputs of the plurality of second column pass transistors together to provide a global complementary bit line.

5. A memory device according to claim 4 wherein the global complementary bit line or the global true bit line extends between opposite sides of the memory cells area toward a write driver circuit and/or a sense amplifier circuit.

6. A memory device according to claim 1 wherein the true and complementary bit lines layout comprise a zig-zag pattern.

7. An integrated circuit memory device comprising:

a memory cell area of the memory device including a plurality of memory cells each coupled to a local true bit line extending across the memory cell area toward a first core area of the memory device and to a complementary local bit line extending across the memory cell area toward a second core area of the memory device opposite the first core area;

a first column pass transistor in the first core area coupled to the true local bit line; and a second column pass transistor in the second core area coupled to the complementary local bit line, wherein the first and second column pass transistors are located to overlap one another in a direction in which local bit lines extend across the memory core area.

8. A memory device according to claim 7 wherein the first and second overlapping column pass transistors comprises a zig-zag pattern so that the first and second column pass transistors are alternatingly arranged on opposing sides of the memory cell area.

9. A bit line layout structure in a semiconductor memory device comprising bit lines and complementary bit lines connected to memory cells coupled to column pass transistors facing each other at opposite sides of the memory cells.

10. The structure according to claim 9 wherein the column pass transistors comprise CMOS (Complementary Metal Oxidation Semiconductor) transmission gates.

11. The structure according to claim 9, wherein the column pass transistors are coupled to precharge transistors.

12. The structure according to claim 9, wherein the bit line and the complementary bit line comprise a local bit line pair coupled to a corresponding global bit line pair.

13. The structure according to claim 9, wherein the bit line and the complementary bit line comprise a local bit line pair coupled to a corresponding global bit line pair.

* * * * *